United States Patent [19]
Ohba et al.

[11] Patent Number: 5,909,040
[45] Date of Patent: *Jun. 1, 1999

[54] SEMICONDUCTOR DEVICE INCLUDING QUATERNARY BUFFER LAYER WITH PINHOLES

[75] Inventors: Yasuo Ohba, Yokohama; Ako Hatano, Tokyo, both of Japan

[73] Assignee: Kabushiki Kaisha Toshiba, Kawasaki, Japan

[*] Notice: This patent is subject to a terminal disclaimer.

[21] Appl. No.: 08/866,056

[22] Filed: May 30, 1997

Related U.S. Application Data

[63] Continuation-in-part of application No. 08/400,865, Mar. 8, 1995, Pat. No. 5,656,832.

[30] Foreign Application Priority Data

Mar. 9, 1994 [JP] Japan ..................................... 6-038157
Jan. 6, 1995 [JP] Japan ..................................... 7-000704

[51] Int. Cl.$^6$ ......................... H01L 33/00; H01L 31/0304
[52] U.S. Cl. ............................. 257/190; 257/13; 257/96; 257/97; 257/103; 372/44; 372/50
[58] Field of Search ............................. 257/96, 97, 103, 257/190, 13; 372/44, 50

[56] References Cited

U.S. PATENT DOCUMENTS

| | | | |
|---|---|---|---|
| 5,006,908 | 4/1991 | Matsuoka | 257/103 |
| 5,239,188 | 8/1993 | Takeuchi | 257/201 |
| 5,247,533 | 9/1993 | Okazaki | 257/13 |
| 5,578,839 | 11/1996 | Nakamura | 257/201 |
| 5,587,593 | 12/1996 | Koide | 257/103 |
| 5,665,986 | 9/1997 | Miura | 257/190 |
| 5,684,309 | 11/1997 | McIntosh | 257/96 |
| 5,729,029 | 3/1998 | Rudaz | 257/13 |

OTHER PUBLICATIONS

Kamp et al *Mat. Res. Soc. Symp. Proceed.* vol. 395 "GaN in Materials" "NH$_3$ in GaN" pp. 135–139, Dec. 1995.

Van der Stricht et al *Mat. Res. Soc. Symp. proceed.* vol. 395 "GaN in Materials" "The Effect of a GaN . . . Deposition" pp. 231–236, Dec. 1995.

*Primary Examiner*—Jerome Jackson, Jr.
*Attorney, Agent, or Firm*—Oblon, Spivak, McClelland, Maier & Neustadt, P.C.

[57] ABSTRACT

A semiconductor device comprises a single crystal substrate, a nucleus formation buffer layer formed on the single crystal substrate, and a lamination layer including a plurality of $Al_{1-x-y}Ga_xIn_yN$ ($0 \leq x \leq 1$, $0 \leq y \leq 1$, $x+y \leq 1$) layers laminated above the nucleus formation buffer layer. The nucleus formation buffer layer is formed of $Al_{1-s-t}Ga_sIn_tN$ ($0 \leq s \leq 1$, $0 \leq t \leq 1$, $s+t \leq 1$) and formed on a surface of the substrate with an average film thickness of 5 nm to 20 nm such that the nucleus formation buffer layer has a number of pinholes for control of polarity and formation of nuclei. The pinholes are formed among loosely formed small crystals of $Al_{1-s-t}Ga_sIn_tN$ ($0 \leq s \leq 1$, $0 \leq t \leq 1$, $s+t \leq 1$).

15 Claims, 7 Drawing Sheets

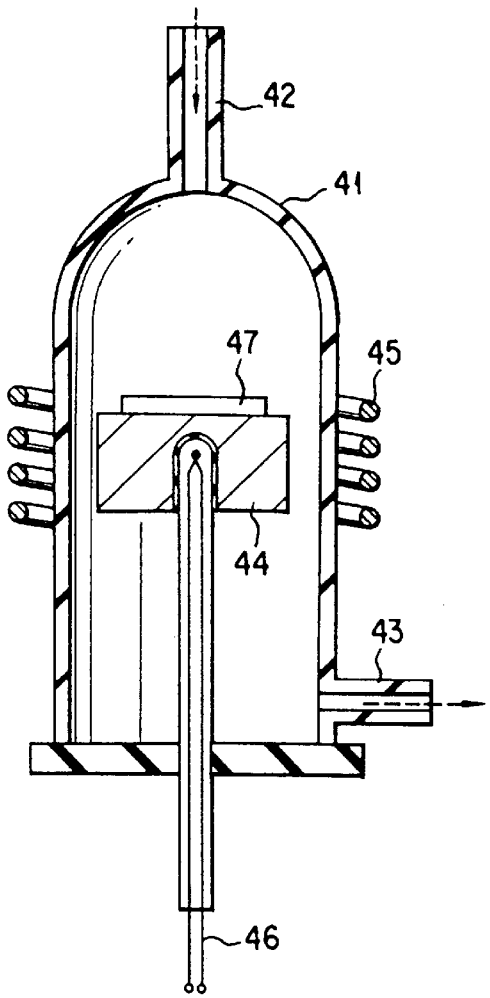
F I G. 4
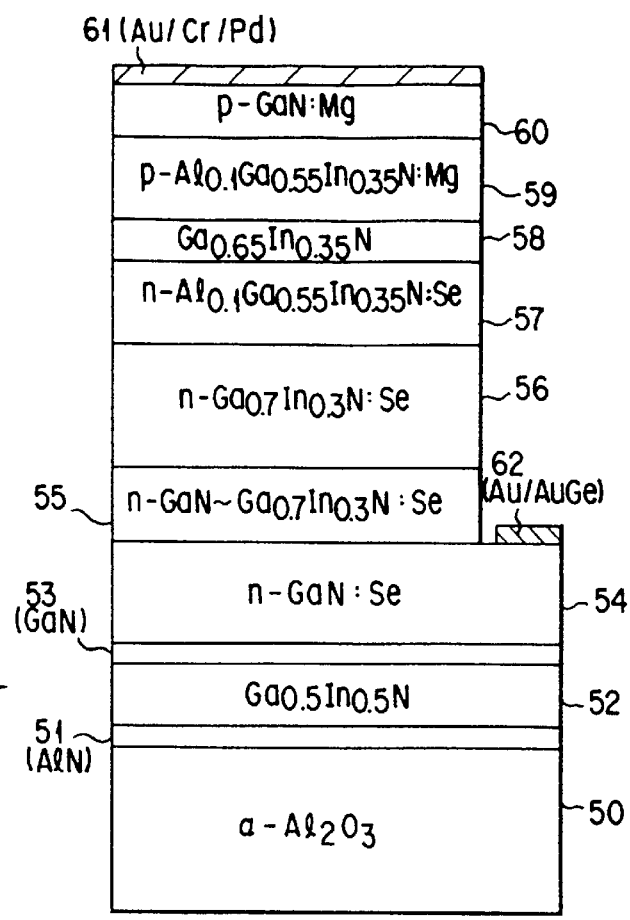
F I G. 6
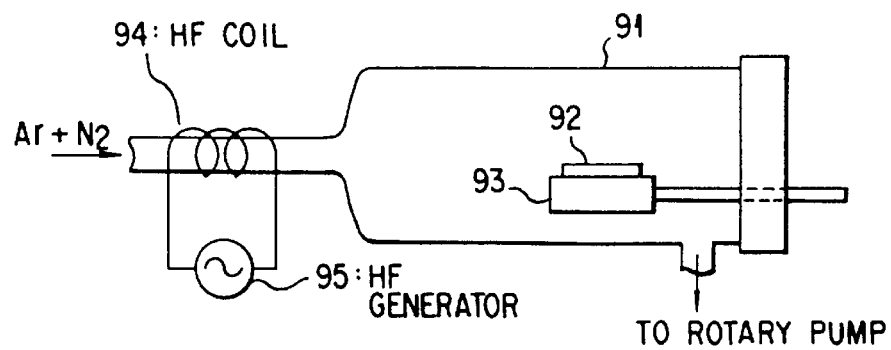
F I G. 5

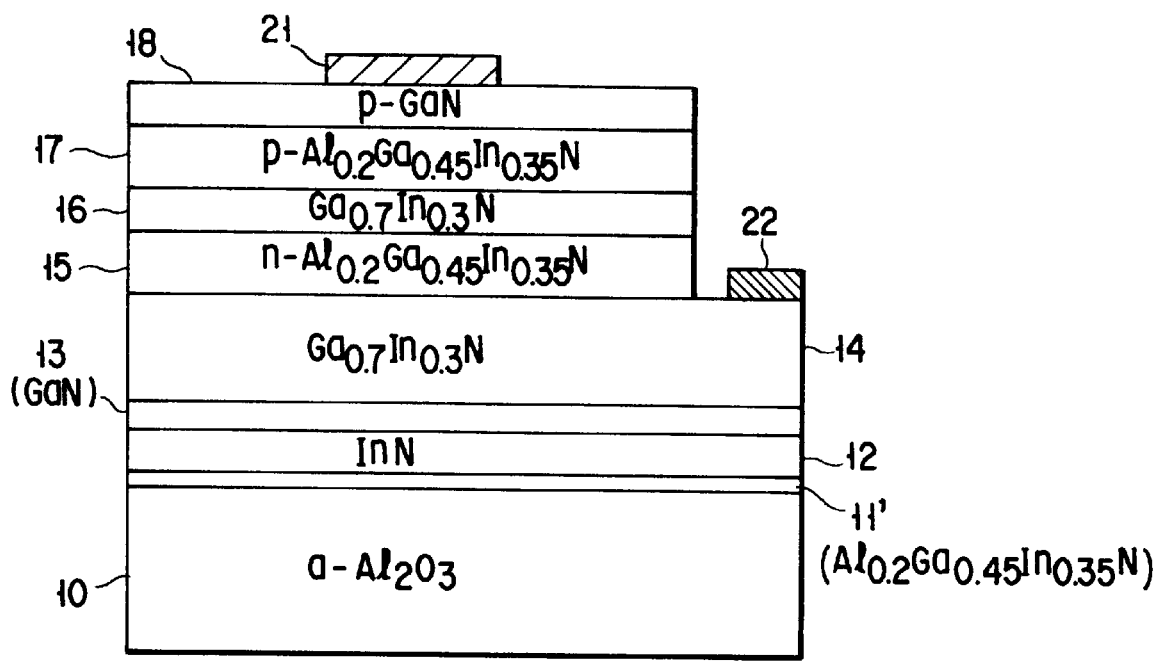
F I G. 15

SEMICONDUCTOR DEVICE INCLUDING QUATERNARY BUFFER LAYER WITH PINHOLES

CROSS-REFERENCE TO RELATED APPLICATION

This application is a continuation-in-part of U.S. patent application Ser. No. 08/400,865 filed Mar. 8, 1995 now U.S. Pat. No. 5,656,832.

BACKGROUND OF THE INVENTION

The present invention relates to a semiconductor device using an AlGaInN-based material and a method of fabricating the same, and relates to an improvement of a buffer layer provided between a substrate and a semiconductor device layer structure, a semiconductor device having a p-type semiconductor layer with reduced resistance and a method of fabricating the same.

One of nitrogen-containing III–V group compound semiconductors, i.e. GaN, which has a large band gap of 3.4 eV and is of direct transition type, has been regarded as a prospective material of a short-wavelength light emitting device. Since there is no substrate with good lattice matching with this type of material, the material is often grown on a sapphire substrate. However, since the possibility of non-matching between sapphire and GaN is high, i.e. about 15%, the material tends to grow in an insular shape. Furthermore, if the thickness of a GaN layer is increased to enhance the quality thereof, a difference in thermal expansion between a sapphire substrate and GaN or $Al_{1-x-y}Ga_xIn_yN$ (where $0 \leq x \leq 1$, $0 \leq y \leq 1$, $x+y \leq 1$, hereinafter referred to as AlGaInN-based material) and lattice non-matching result in an increase in dislocation or cracks at the time of growing and/or cooling. Consequently, it is difficult to grow a high-quality film.

On the other hand, in order to reduce the influence of lattice non-matching, there is a known method in which a very thin film of amorphous or polycrystal AlN or GaN is formed as a buffer layer on a sapphire substrate by low-temperature growth. In this case, it is considered that the amorphous or polycrystal buffer layer reduces thermal distortion, small crystals contained in the buffer layer become orientated seeds at high temperature of 1000° C., and the crystal quality of the GaN layer is enhanced.

In the case of adopting this method, the crystal quality represented by, e.g. a full width at half maximum of X-ray diffraction depends greatly on the growth conditions of the buffer layer. Specifically, when the thickness of the buffer layer is great, the orientation of the seeds, which become the nuclei of the film formation, are disturbed and the crystal quality deteriorates. On the other hand, although the full width at half maximum decreases as the thickness of the buffer layer decreases, the function of the buffer layer is completely lost by an excessively small thickness of the buffer layer and the surface condition of the crystal deteriorates suddenly. In other words, the growth conditions of the buffer layer are strictly limited and the crystal quality is not satisfactory.

As has been stated above, in the prior art, it is difficult to crystal-grow a high-quality AlGaInN-based thin film on the sapphire substrate. Moreover, even if the amorphous or polycrystal buffer layer is used, the growth conditions of the buffer layer are strictly limited and the crystal quality of the AlGaInN-based thin film formed on the buffer layer is not satisfactory. Therefore, it is difficult to fabricate a semiconductor light emitting device with high luminance and short wavelength by using the AlGaInN-based material.

When this type of semiconductor device is used as a semiconductor laser, etc., it is necessary to provide means for forming a low-resistance p-type layer. In the prior art, it is difficult to grow a low-resistance p-type layer with GaN. Recently, however, the resistance of the GaN layer can be decreased by radiating an electron beam or by heating in a nitrogen gas atmosphere the GaN layer to which Mg is added. It appears that the resistance can be decreased by virtue of dissociation of hydrogen from the crystal.

The inventors of the present invention, however, have discovered that the electrical activation ratio of Mg in the GaN layer is still low, and it is necessary to add Mg at a very high concentration of about $10^{19}$ cm$^{-3}$ to about $10^{20}$ cm$^{-3}$ in order to obtain a low-resistive p-type layer of 1 Ω cm or less which is necessary to fabricate a high-performance device such as a semiconductor laser. The addition of Mg at high concentration results in an increase in crystal defects and deterioration in surface flatness. Thus, it is not possible to achieve a high-performance, short-wavelength semiconductor laser, etc.

On the other hand, Jpn. Pat. Appln. KOKAI Publication No. 5-183189 proposes a method of a low-resistance p-type GaN layer by forming an AlN layer as a cap layer on a GaN layer to which Mg is added, and then annealing the resultant. In this method, however, the electrical activation of Mg is not fully achieved.

As has been described above, in the prior art, when a semiconductor layer of an AlGaInN-based compound (a nitride-series Group III–V compound semiconductor layer) is grown, it is necessary to add Mg (acceptor impurity) excessively as a dopant in order to low-resistance p-type layer. As a result, crystal defects increase and surface flatness deteriorates.

BRIEF SUMMARY OF THE INVENTION

The object of the present invention is to provide a semiconductor device wherein a high-quality AlGaIn semiconductor layer can be formed, with high reproducibility, on a non-lattice-mismatching substrate and, for example, a high-luminance short-wavelength semiconductor light emitting device can be obtained.

In order to achieve the above object, there is provided a semiconductor device comprising:

a single crystal substrate;

a nucleus formation buffer layer formed on the single crystal substrate; and a lamination layer including a plurality of $Al_{i-x-y}Ga_xIn_yN$ ($0 \leq x \leq 1$, $0 \leq y \leq 1$, $x+y \leq 1$) layers laminated above the nucleus formation buffer layer, wherein the nucleus formation buffer layer is formed of $Al_{1-s-t}Ga_sIn_tN$ ($0 < s \leq 1$, $0 \leq t \leq 1$, $s+t \leq 1$) and formed on a surface of the substrate with an average film thickness of 5 nm to 20 nm such that the nucleus formation buffer layer has a number of pinholes for control of polarity and formation of nuclei, the pinholes being formed among loosely formed small crystals of $Al_{1-s-t}Ga_sIn_tN$ ($0 \leq s \leq 1$, $0 \leq t \leq 1$, $s+t \leq 1$).

It is desirable that the $Al_{1-s-t}Ga_sIn_tN$ ($0 \leq s \leq 1$, $0 \leq t \leq 1$, $s+t \leq 1$), of which the nucleus formation buffer layer is formed, be $Al_{1-s}Ga_sN$ ($0 < S \leq 1$).

The $Al_{1-s-t}Ga_sIn_tN$ ($0 \leq s \leq 1$, $0 \leq t \leq 1$, $s+t \leq 1$), of which the nucleus formation buffer layer is formed, may be GaN.

It is desirable that the nucleus formation buffer layer be formed in an atmosphere containing ammonia supplied at a flow rate of 1/200 to 1/50 of a total flow rate of material gases.

It is desirable that a temperature raising process from the completion of formation of the nucleus formation buffer layer to the beginning of formation of the lamination layer be performed in an ammonia-free atmosphere.

It is desirable that the lamination layer be formed in an atmosphere at 70 Torr or less.

It is desirable that the semiconductor device the single crystal substrate be formed of sapphire, and that a face to be processed of the single crystal substrate be a c face of the sapphire substrate.

The face to be processed of the single crystal substrate may be inclined by 0.5 to 10 degrees from a c face toward an a face of the sapphire substrate.

It is desirable that the lamination layer constitute a light emitting diode of a double hetero structure wherein an active layer is sandwiched between a p-type cladding layer and an n-type cladding layer.

It is desirable that the semiconductor device further comprises a distortion reducing buffer layer formed of $Al_{1-u-v}Ga_uIn_vN$ ($0 \leq u \leq 1$, $0 \leq v \leq 1$, $u+v \leq 1$) on the nuclei formation buffer layer, a thickness of the distortion reducing buffer layer being greater than that of the nuclei formation buffer layer.

It is desirable that the distortion reducing buffer layer be grown at temperatures between 350° C. and 800° C.

It is desirable that the $Al_{1-u-v}Ga_uIn_vN$ ($0 \leq u \leq 1$, $0 \leq v \leq 1$, $u+v \leq 1$), of which the distortion reducing buffer layer is formed, be $Ga_{1-v}In_vN$ ($0 \leq v \leq 1$).

It is desirable that the semiconductor device further comprise a cap layer, provided on the distortion reducing buffer layer, for preventing evaporation of In contained in the distortion reducing buffer layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross-sectional view showing schematically the structure of a growing apparatus used in fabricating the device of the first embodiment;

FIG. 5 is a cross-sectional view showing schematically the structure of an annealing apparatus used in the first embodiment;

FIG. 6 is a cross-sectional view showing the device structure of a light-emitting diode according to a second embodiment of the invention;

FIG. 15 is a cross-sectional view showing a device structure of a light emitting diode according to a modification of the first embodiment, wherein an AlGaInN layer is used as the first buffer layer.

DETAILED DESCRIPTION OF THE INVENTION

Figure 1:
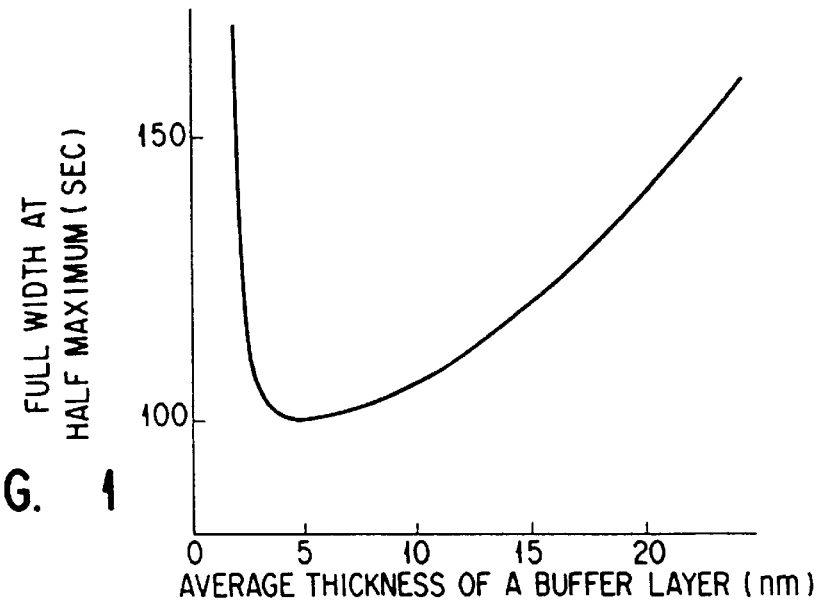
FIG. 1 is a characteristic graph showing the relationship between the thickness of an AlN buffer layer and the full width at half maximum at X-ray diffraction of a GaN layer.

Prior to describing embodiments of the present invention, a description will first be given of a buffer layer between a substrate and a semiconductor device lamination structure.

The inventors of the present invention discovered through researches that nucleus formation for controlling polarity of growth surface is substantially important as a function of a buffer layer, in addition to reduction of lattice non-matching, which has been conventionally thought. Specifically, if a GaN layer is directly grown on a sapphire substrate without providing a buffer layer, nitrogen material reacts with substrate crystals. Since sapphire has a nonpolar crystal structure, the polarity of a produced nitride is disturbed.

On the other hand, when a buffer layer is grown at low temperatures below 700° C., material molecules functioning as an N (nitrogen) supply source of Group V element or a decomposed substance thereof stay on the substrate surface effectively, and an N atom surface is first formed. Thereby, the growth surface is controlled to surface A on which Group III atoms appear. Accordingly, when ammonia with low decomposition ratio is used as N material, the formation of a Group V atomic surface (surface B), which may become unstable due to deficiency of N material, can be curbed. This is a principal reason why the quality of crystals in the buffer layer formed by low-temperature growth can be improved.

Therefore, the nucleus formation for polarity control of the growth surface is important as a function of the buffer layer. It is not necessary that the nuclei having this function be present as a complete film. Rather, it is desirable that the nuclei be formed as a film with many pinholes. This enhances the crystal quality, independent of growth conditions, thickness, etc. of the buffer layer. Normally, at the substrate temperature above 800° C., nuclei of GaN do not easily form on the surface of the sapphire substrate. If a low-temperature growth buffer layer is provided, GaN grows from nuclei performed at low temperatures in a horizontal direction along the surface of the substrate. It is considered that there is substantially no crystal defects due to lattice non-matching in a region grown from the nuclei horizontally.

In the prior art, in the case where the buffer layer is thin, sudden degradation in crystal quality is considered to occur due to the fact that the substrate reacts directly with nitrogen material and a portion with disturbed polarity forms. Specifically, in the case where a GaN layer for forming a semiconductor device is grown on a sapphire substrate with, e.g. an AlN buffer layer interposed, a Group III material, e.g. TMA (tri-methyl-aluminum), and a Group V material, e.g. $NH_3$, are supplied to form a buffer layer. Then, the supply of the Group III material is stopped, and the resultant is heated up to a predetermined temperature. Subsequently, another Group III material, e.g. TMG (tri-methyl-gallium), is supplied to start the growth of a GaN layer. At this time, since the Group V material is kept being supplied, the substrate reacts directly with ammonia or the Group V material in the temperature-increasing process if the buffer layer is thin.

By contrast, if the temperature-increasing process is performed in an atmosphere containing a small amount of nitrogen material alone for preventing dissociation of nitrogen atoms, and containing no ammonia, for example in a hydrogen atmosphere, the nuclei can be formed without nitriding the surface of the substrate. In this case, however, gases having sharply different thermal qualities, such as hydrogen and ammonia, are interchanged after the temperature is raised and the thermal quality of the atmospheric gas is varied. Consequently, the surface temperature of the substrate varies. The inventors discovered the fact that it is important that the growth be performed under a reduced pressure of 70 Torr or less, preferably 1–40 Torr, at which the thermal conductivity of gases decreases steeply.

FIG. 1 shows the relationship between the thickness of an AlN buffer layer heated in hydrogen and the full width at half maximum at X-ray diffraction of a GaN layer grown on the AlN buffer layer. When the thickness of the buffer layer is less than 10 nm, i.e. in the range of 3–8 nm, an epitaxial layer of much higher quality than in the prior art is obtained. In this case, the buffer layer is not a complete film, but a film with many pinholes and loosely formed small AlN crystals. The fact that a high-quality epitaxial layer can be obtained with the thickness of the buffer layer being less than 10 nm means that the conditions for growth of the buffer layer are relaxed, and this contributes to higher productivity.

When a buffer layer with many pinholes is formed, layer portions growing on those areas of the substrate surface, which are exposed by pinholes, grow from small nuclei. Thus, lateral growth is facilitated and a layer with small defect can be grown. When it is needed to more facilitate lateral crystal growth, the best result will be obtained by using a substrate having a sapphire C face. If a substrate with a variance in the face orientation or with surface defects is used, it is effective to use a substrate with an inclination of 0.5° to 10° (preferably 1° to 5°) from C face to A face. By using such an inclined-face substrate, a film with higher quality can be obtained.

The interval of AlN small crystals functioning as nuclei is determined by the temperature for growth, and this interval increases as the temperature rises. For smooth lateral growth, high temperatures at which the interval of nuclei increases are desirable. However, in high-temperature growth the polarity of nuclei is disturbed and the temperature for growth of the buffer layer is limited. Good results were obtained in the range of 350° C. to 800° C., preferably in the range of 500° C. to 700° C.

In this method, too, if the thickness of a GaN layer is increased to enhance the quality thereof, the growth temperature of the GaN is set high at about 1000° C. Thus, a dislocation will increase at the time of cooling owing to a difference in thermal expansion between the sapphire substrate and GaN (or AlGaInN) or cracks will occur. Accordingly, in order to reduce thermal distortion, it is necessary to thicken the buffer layer, lower the growth temperature, and reduce distortion due to the difference in temperature. However, if the first buffer layer for forming nuclei is thickened, the orientation of the seeds which become growth nuclei is disturbed, resulting in degradation in crystal quality. Thus, in the present invention, a second buffer layer for reducing thermal distortion is laminated on the first buffer layer for forming the growth nuclei.

It is not necessary that the buffer layer for reducing thermal distortion be amorphous or polycrystalline. Accordingly, a material containing In (indium) as a constituent element, which has been considered to tend to become a single crystal because of its low crystallization temperature, may be used as a second buffer layer. Specifically, a bonding force acting between In and N is weak and In has flexibility in relation to AlN. Thus, a buffer layer containing In as a constituent element can be effectively reduce distortion. It should be noted, however, that the second buffer layer may be formed of, other than the material containing In as a constituent element, a material having a wider band gap than the first buffer layer, which has generally good flexibility. In this case, it is more effective to use a buffer layer of substantially a single crystal which permits an increase in film thickness.

The effective thickness of the second buffer layer for reducing thermal distortion is in a range of 50 nm to 1000 nm. When the In composition is 10 atom % to 90 atom %, the layer grows most easily. Although In has a high mobility and can be formed in a wide temperature range of 300° C. to 1100° C., nuclei are difficult to form. Thus, in order to grow a buffer layer of a material including a great quantity of In as a constituent element, it is desirable to grow in advance a layer having a small In composition.

As has been described above, in order to form small growth nuclei, it is effective that the first buffer layer for forming the nuclei is made of a material having a wide band gap and, e.g. a great Al composition. It is also effective that the second buffer layer for reducing thermal distortion is formed of a material having a narrow band gap and, e.g. a great In composition. When a device structure is formed of an AlGaInN-based material on the second buffer layer for reducing thermal distortion, it is desirable that a cap layer not containing In, such as GaN, AlN or AlGaN, be performed in a substrate temperature range of 500° C. to 800° C. at which dissociation of In is not quick, thereby preventing dissociation of In of the second buffer layer. It is desirable that the thickness of the cap layer be in a range of 50 nm to 1000 nm.

In the present invention, the term "buffer layer" refers to a layer having a film shape or many pinholes for the purpose of formation of nuclei, control of polarity, reduction in thermal distortion, etc.

According to the present invention, a buffer layer of AlN, etc. having many pinholes is formed on a single crystal substrate of sapphire, etc., so that AlN small crystals are loosely formed on the substrate. These small crystals become nuclei of lateral epitaxial growth of a semiconductor layer. After the buffer layer is formed, the resultant is heated in, e.g. a hydrogen atmosphere containing no ammonia until the growth of a plurality of semiconductor layers is started to form a semiconductor device. Thereby, a reaction between the substrate surface and nitrogen can be prevented and the disturbance in polarity of the substrate surface can be prevented. Therefore, the crystal quality and reproducibility of the plural semiconductor layers formed on the buffer layer can be enhanced. As a result, an AlGaInN layer with less defects can be grown, and a high-luminance short-wavelength light emitting device can be realized.

Besides, by forming a second buffer layer of InN, GaInN, etc. on a first buffer layer of AlN, etc., the second buffer layer can function as a thermal distortion reducing layer and the crystal quality of a plurality of semiconductor layers formed on the buffer layer can be enhanced effectively.

Embodiments of the present invention will now be described with reference to the accompanying drawings.

(Embodiment 1)

Figure 2:
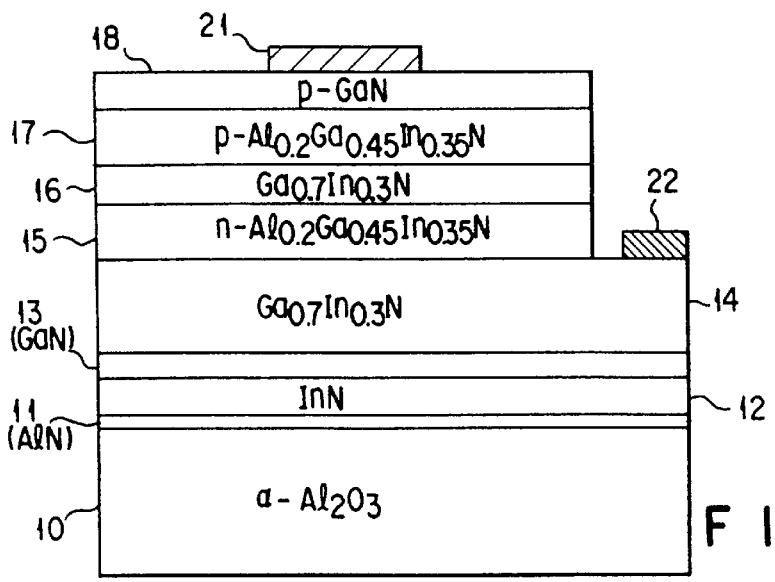
FIG. 2 is a cross-sectional view showing the device structure of a light-emitting diode according to a first embodiment of the invention.

FIG. 2 is a cross-sectional view showing a device structure of a blue light emitting diode according to a first embodiment of the invention. Specifically, an AlN first buffer layer 11 (9 nm) for forming growth nuclei and controlling polarity is formed on a C face of a sapphire substrate (single crystal substrate) 10 at 580° C. An InN second buffer layer 12 (0.5 $\mu$m) for reducing thermal distortion is formed on the resultant at 500° C. A GaN gap layer 13 (0.1 $\mu$m) for preventing evaporation of In is formed on the resultant.

After the layers 11–13 are formed, the resultant is heated up to 1050° C. in an ammonia-free hydrogen atmosphere, and the following layers are successively formed: an $Ga_{0.7}In_{0.3}N$ defect reducing layer 14 (3.0 $\mu$m) for reducing a lattice defect; an Si-doped n-type $Al_{0.2}Ga_{0.45}In_{0.35}N$ cladding layer 15 (1.0 $\mu$m) functioning as a light emitter; a $Ga_{0.7}In_{0.3}N$ active layer 16 (0.5 $\mu$m); an Mg-doped p-type $Al_{0.2}Ga_{0.45}In_{0.35}N$ cladding layer 17 (1.0 $\mu$m); and an Mg-doped p-type GaN contact layer 18 (0.5 $\mu$m).

An Au/Cr/Pd layer is formed as a p-type electrode 21 on the contact layer 18. An Au/AuGe layer is formed as an n-side electrode 22 on the defect reducing layer 14.

In this structure, the AlN first buffer layer 11 is loosely formed on the substrate 10 and has many pinholes. The AlN first buffer layer 11 becomes effective nuclei for growth of an AlGaInN-based semiconductor layer for fabricating a device in a subsequent process. Further, the InN second buffer layer 12 functions as a thermal distortion reducing layer and can prevent dislocation and cracks due to a difference in thermal expansion between the AlGaInN-based semiconductor layer and the substrate 10. Specifically, a high-quality AlGaInN-based semiconductor layer can be formed by virtue of the functions of the two buffer layers 11 and 12, and a high-luminance short-wavelength light emitting diode can be realized.

Figure 3A:
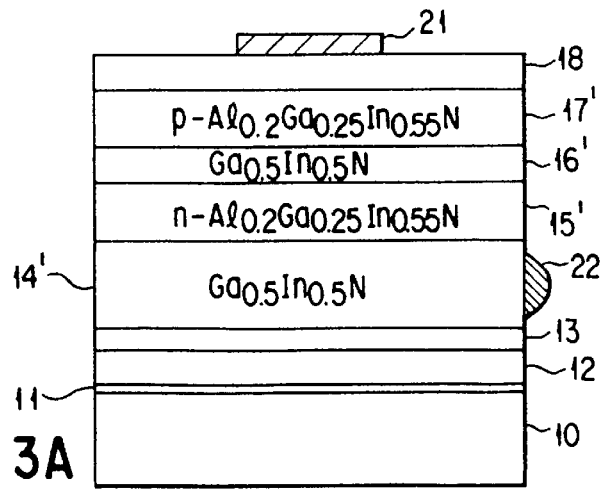
FIGS. 3A to 3E are cross-sectional views of light-emitting diodes according to modifications of the first embodiment.
Figure 3B:
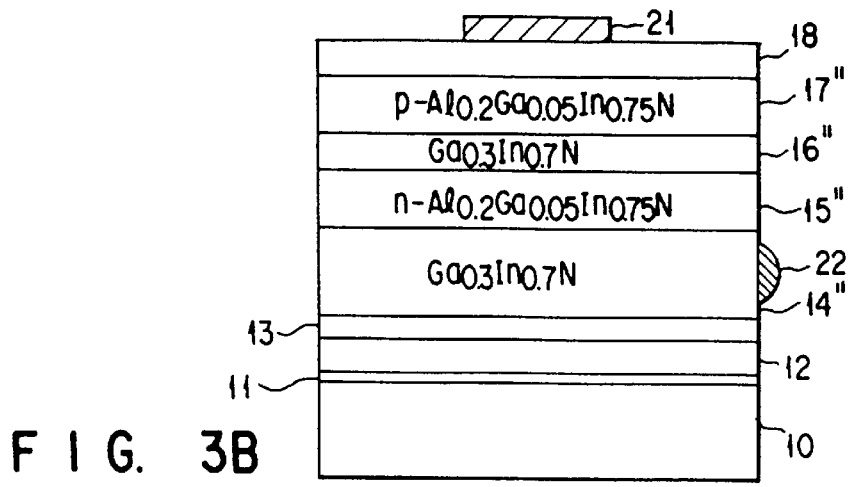

FIGS. 3A and 3B show structures wherein the band gap of the active layer 16 is varied to alter the wavelength of emitted light. FIG. 3A shows an example of a green light emitting diode wherein the composition of a defect reducing layer 14' is $Ga_{0.5}In_{0.5}N$, the composition of cladding layers 15' and 17' is $Al_{0.2}Ga_{0.25}In_{0.55}N$, and the composition of an active layer 16' is $Ga_{0.5}In_{0.5}N$. FIG. 3B shows an example of a red light emitting diode wherein the composition of a defect reducing layer 14" is $Ga_{0.3}In_{0.7}N$, the composition of cladding layers 15" and 17" is $Al_{0.2}Ga_{0.05}In_{0.75}N$, and the composition of an active layer 16" is $Ga_{0.3}In_{0.7}N$.

Figure 3C:
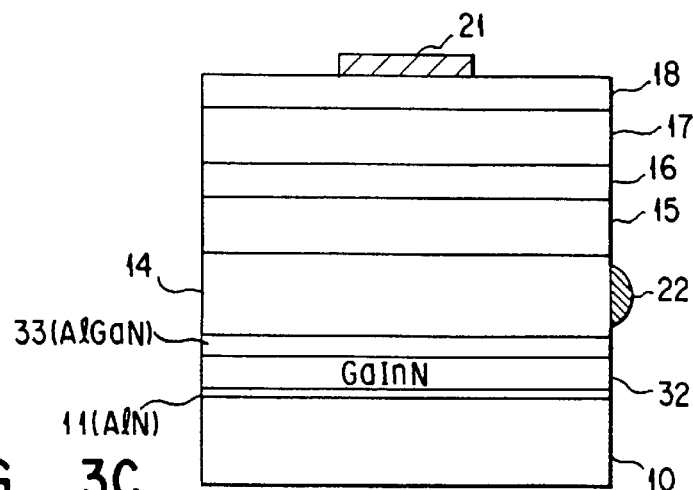
Figures 3D, 3E:
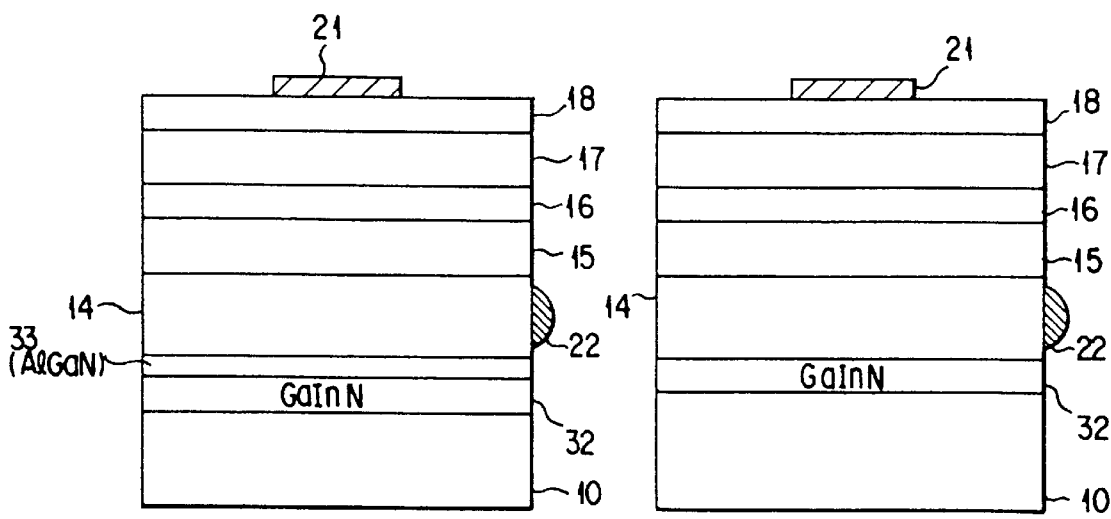

FIG. 3C shows a structure wherein a $Ga_{0.5}In_{0.5}N$ mixed crystal is used as a second buffer layer 32 for reducing thermal distortion and AlGaN is used as a cap layer 33. In this structure, the first buffer layer 11 for forming nuclei may be omitted, as shown in FIG. 3D. Another mixed crystal of $Al_{0.5}In_{0.5}N$, etc. may be similarly used as thermal distortion reducing buffer layer 32. In the case where a mixed crystal is used as second buffer layer 32, the cap layer 33 for preventing evaporation of In may be omitted, as shown in FIG. 3E, since evaporation of In is slow.

FIG. 4 shows schematically the structure of a growing apparatus used in fabricating the device of this embodiment. Reference numeral 41 is a reaction tube of quartz into which a material mixture gas is introduced from a gas introducing port 42. The gas within the reaction tube 41 is exhausted from a gas exhaust port 43.

A susceptor of carbon 44 is disposed within the reaction tube 41, and a substrate 47 is mounted on the susceptor 44. The susceptor 44 is heated by induction using a high-frequency coil 45. The temperature of the substrate 47 is measured by a thermocouple 46 and controlled by control apparatus (not shown).

A description will now be given of a method of fabricating a light emitting diode with use of the growing apparatus (shown in FIG. 4). At first, the substrate 47 (sapphire substrate 10 in FIG. 2) is mounted on the susceptor 44. High-purity hydrogen is introduced from the gas introducing port 42 at a rate of 1 l/min., and the gas within the reaction tube 41 is replaced. Then, the gas exhaust port 43 is connected to a rotary pump and the pressure within the reaction tube 41 is reduced to 20 to 70 Torr.

Subsequently, the substrate 47 is heated within hydrogen at 1100° C. and the surface of the substrate 47 is cleaned. Following this, the temperature of the substrate is lowered to 450 to 900° C., and $H_2$ gas is changed to $NH_3$ gas, $N_2H_4$ gas, or an N-containing organic compound, e.g. $(CH_3)_2N_2H_2$. In addition, an organic metal compound according to a layer to be grown is introduced, thereby forming the layer. When the AlN buffer layer 11 is formed, for example, an organic metal Al compound, e.g. $Al(CH_3)_3$ or $Al(C_2H_5)_3$ is introduced. When the GaN second buffer layer 12, active layer 14 and contact layer 16 are formed, an organic Ga compound, e.g. $Ga(CH_3)_3$ or $Ga(C_2H_5)_3$ is introduced to form them. When the AlGaN cladding layers 13 and 15 are formed, both of an organic metal Al compound and an organic metal Ga compound are introduced to form them. In order to narrow the band gap of the GaN active layer 14, In (indium) may be added. In this case, In is added by introducing an organic metal In compound, e.g. $In(CH_3)_3$ or $In(C_2H_5)_3$.

When doping is carried out, a doping material is introduced simultaneously. An n-type doping material for forming the cladding layer 13 is an Si hydride such as $SiH_4$ or an organic metal Si compound such as $Si(CH_3)_4$. A p-type doping material for forming the cladding layer 15 and contact layer 16 is an organic metal Mg compound such as $(C_2H_5)_2Mg$ or an organic metal Zn compound such as $Zn(CH_3)_2$, etc. In order to improve the ratio of incorporated In, a layer containing In is grown in an atmosphere containing no nitrogen, Ar etc., and $(CH_3)_2N_2H_2$ having a higher decomposition ratio than ammonia is used as material.

In order to increase the ratio of activation of p-type dopant, it is necessary to prevent mixing of hydrogen into a crystal. For this purpose, in the higher temperature range between the growth temperature and 850° C. to 700° C., the substrate is cooled in ammonia in order to prevent dissociation of nitrogen. In the lower temperature range under 850° C. to 700° C., the substrate is cooled with a gas containing no $NH_3$ in order to prevent mixture of hydrogen from $NH_3$ or a carrier gas in the cooling process. Furthermore, when it is necessary to increase the ratio of activation of p-type dopant, thermal treatment is effected in a nitrogen radical produced by an RF plasma. This is for the reason that heat treatment can be performed at high temperatures of 900° C. to 1200° C., owing to the fact that dissociation of nitrogen atoms from the crystal can be prevented perfectly, and crystalline defects such as nitrogen cavities can be eliminated.

Specifically, films are grown such that $NH_3$ is introduced as material at a rate of $1 \times 10^{-3}$ mol/min., $Ga(CH_3)_3$ is introduced at a rate of $11 \times 10^{-5}$ mol/min., and $Al(CH_3)_3$ is introduced at a rate of $1 \times 10^{-6}$ mol/min. The temperature of the substrate is 1050° C., the pressure is 38 Torr, the total flow amount of material gas is 1 l/min., the n-type dopant is Si, and the p-type dopant is Mg. The materials are $Si(CH_3)_4$ and $(C_5H_5)_2Mg$, respectively.

The thus obtained semiconductor substrate was evaluated by X-ray diffraction. It was found that the crystalline defect reduced remarkably, and realization of high-luminance, short-wavelength light emitting devices could be expected. On the other hand, it is possible to curb release of N in annealing and reduce the resistance of p-type layers 17 and 18, by annealing the semiconductor substrate in a nitrogen radical at 400° C. to 1200° C. (preferably 700° C. to 1000° C.). FIG. 5 shows schematically an annealing apparatus. Reference numeral 91 denotes a reaction tube, numeral 92 a wafer, 93 a susceptor with an additional function of a heater, 94 a high-frequency coil for activating a gas, and 95 a high-frequency power supply. Specifically, the semiconductor substrate was annealed within the shown apparatus at 1000° C. for 30 minutes.

It is also effective that annealing is performed in a nitrogen-containing compound (an active nitride) which releases no active hydrogen. Specifically, if annealing is carried out in an organic compound having an azide group, e.g. ethyl azide, dissociation of N can be prevented in the annealing and H is not incorporated. Thus, the resistance of the p-type layer can be further reduced.

In the above-described first embodiment (FIGS. 2 and 3A to 3E), the first buffer layer for nuclei formation and polarity control is formed of AlN. However, the material of the first buffer layer is not limited to AlN. Any material represented generally by $Al_{1-s-t}Ga_sIn_tN$ ($0 \leq s \leq 1$, $0 \leq t \leq 1$, $s+t \leq 1$) can be used.

However, the first buffer layer, if containing Ga, should preferably have a thickness of 5 to 20 nm for the reason below. Since the binding energy of Ga is small, the surface mobility thereof is high and Ga moves easily. As a result, the size of a grain for nuclei formation increases, i.e. about double the size of AlN. Therefore, the thickness of the buffer layer is properly 5 to 20 nm.

FIG. 15 is a cross-sectional view showing, as a modification of the first embodiment, a device structure of a blue light emitting diode using AlGaInN as nucleus formation buffer layer 11'. Specifically, an $Al_{0.2}Ga_{0.45}In_{0.35}N$ first buffer layer 11' (12 nm) for forming growth nuclei and controlling polarity is formed on a C face of a sapphire substrate (single crystal substrate) 10. An InN second buffer layer 12 (0.5 $\mu$m) for reducing thermal distortion is formed on the resultant. A GaN gap layer 13 (0.1 $\mu$m) for preventing evaporation of In is formed on the resultant.

Subsequently, the following layers are formed on the resultant: a $Ga_{0.7}In_{0.3}N$ defect reducing layer 14 (3.0 $\mu$m) for reducing a lattice defect; an Si-doped n-type $Al_{0.2}Ga_{0.45}In_{0.35}N$ cladding layer 15 (1.0 $\mu$m) functioning as a device; a $Ga_{0.7}In_{0.3}N$ active layer 16 (0.5 $\mu$m); an Mg-doped p-type $Al_{0.2}Ga_{0.45}In_{0.35}N$ cladding layer 17 (1.0 $\mu$m); and an Mg-doped p-type GaN contact layer 18 (0.5 $\mu$m).

Except for the formation of the first buffer layer 11' (AlGaInN), the method of fabricating this light emitting diode is the same as that of fabricating the light emitting diode using the AlN buffer layer, which has been described with reference to FIGS. 2 and 4. Therefore, a description of the method is omitted.

The first buffer layer 11 is formed in the following manner. The layer is grown by introducing, as material gases, $NH_3$ at a rate of 2.2 to $8.9 \times 10^{-4}$ mol/min, $Ga(CH_3)_3$ at a rate of $1 \times 10^{-5}$ mol/min, $Al(CH_3)_3$ at a rate of $1 \times 10^{-6}$ mol/min, and $In(CH_3)_3$ at a rate of $1 \times 10^{-5}$ mol/min. The temperature of the substrate is 1050° C., the pressure is 38 torr, and the flow rate of the total material gases is 1 liter/min. In this case, it is important that the flow rate of ammonia be set at 1/50 to 1/200 of the total flow rate, i.e. that the ratio of Group V material to Group III material be set at 22 to 89. Under these conditions, a buffer layer most effective for suppression of dissociation of nitrogen and for formation of growth nuclei is formed.

The above conditions are applied to the formation of the $Al_{0.2}Ga_{0.45}In_{0.35}N$ layer. If no Al or no In is contained (i.e. GaInN layer or AlGaN layer), it should suffice that the supply of Al material gas or In material gas is stopped.

(Embodiment 2)

FIG. 6 is a cross-sectional view showing the device structure of a light emitting diode according to a second embodiment of the present invention. In this embodiment, a contact layer is provided not only on the p-side but also on the n-side, thereby further enhancing the efficiency.

An AlN first buffer layer 51 (9 nm) for forming a growth nucleus and controlling polarity is formed on the C face of a sapphire substrate 50 at 350° C., and then a $Ga_{0.5}In_{0.5}N$ second buffer layer 52 (0.5 $\mu$m) for reducing thermal distortion is formed at 550° C. A GaN cap layer 53 (0.5 $\mu$m) for preventing In evaporation is formed on the second buffer layer 52 at 650° C.

After the layers 51 to 53 are formed, the resultant is heated up to 1050° C. in an ammonia-free hydrogen atmosphere and the following layers are successively formed: an Se or S doped n-type GaN contact layer 54 (2.0 $\mu$m); an Se or S doped GaInN (from GaN to $Ga_{0.7}In_{0.3}N$) composition grading layer 55 (1.0 $\mu$m) for reducing lattice mismatch; an Se or S doped $Ga_{0.7}In_{0.3}N$ defect-reducing layer 56 (4.0 $\mu$m) for reducing crystalline defect; an Se or S doped ($1 \times 10^{18}$ $cm^{-3}$) n-type $Al_{0.1}Ga_{0.55}In_{0.35}N$ cladding layer 57 (1.0 $\mu$m) functioning as a light emitter; a $Ga_{0.7}In_{0.3}N$ active layer 58 (0.5 $\mu$m); an Mg or Zn doped ($1 \times 10^{18}$ $cm^{-3}$) p-type $Al_{0.1}Ga_{0.55}In_{0.35}N$ cladding layer 59 (1.0 $\mu$m); and an Mg or Zn doped ($5 \times 10^{18}$ $cm^{-3}$) p-type GaN contact layer 60 (0.5 $\mu$m).

Subsequently, Pd: 500 nm, Cr: 100 nm and Au: 500 nm are formed on the contact layer 60, and AuGe: 100 nm, and Au: 500 nm are formed on the contact layer 54. The resultant is subjected to heat treatment at 400° C. to 800° C. in an inert gas or $N_2$, thus forming ohmic electrodes (p-side electrode 61 and n-side electrode 62).

With this structure, too, a high-quality AlGaInN-based semiconductor layer can be formed by virtue of the functions of the AlN first buffer layer 51 and GaInN second buffer layer 52, and the same advantage as with the first embodiment can be obtained. In addition, in the present embodiment, since a lattice mismatch of 0.3% is provided between the active layer 58 and cladding layers 57 and 59, the light emission wavelength is increased and the degree of absorption can be reduced.

Figure 7:
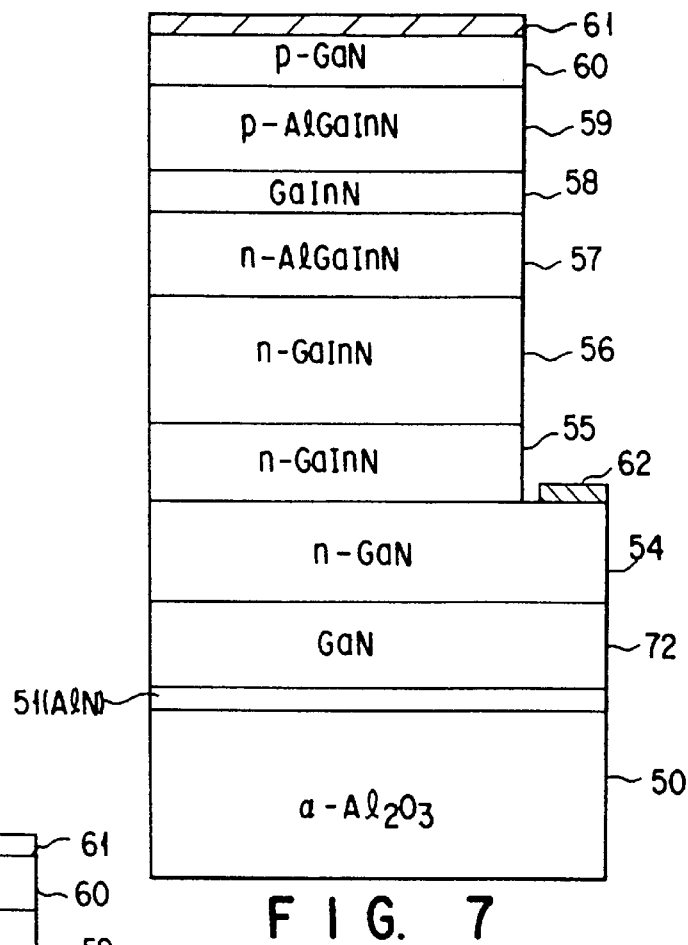
FIGS. 7 and 8 are cross-sectional views of light-emitting diodes according to modifications of the second embodiment.

In the present embodiment, the composition grading layer 55 is provided for reducing lattice mismatch. However, grading is not necessarily required. The thermal distortion reducing layer is not limited to GaInN, and GaN can also be used, as shown in FIG. 7. In this case, an AlN first buffer layer 51 (9 nm) for forming growth nuclei and controlling polarity is grown on a C face of a sapphire substrate 50 at 350° C. A GaN second buffer layer 72 (0.5 $\mu$m) for reducing thermal distortion is grown on the first buffer layer 51 at 550° C. Subsequently, layers 54 to 60 are formed similarly with the structure as shown in FIG. 6.

Figure 8:
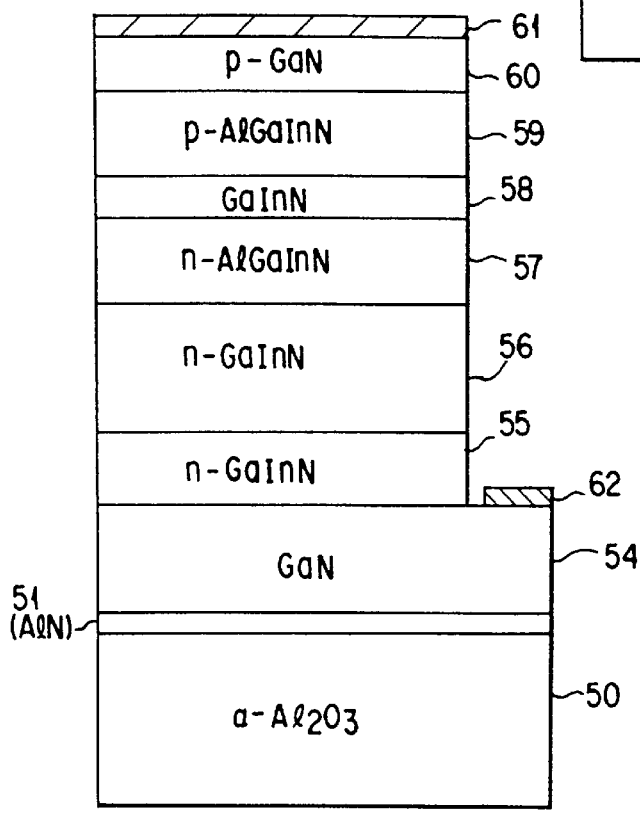

No buffer layer for reducing thermal distortion may be provided, as shown in FIG. 8. An AlN first buffer layer 51 (average thickness: 5 nm) for forming growth nuclei and controlling polarity is grown on a substrate 50 which is set off by 5° from a C face to an A face of sapphire. Subsequently, layers 54–60 are formed similarly with the structure as shown in FIG. 6.

In order to form nuclei, a layer having many pinholes formed loosely is desirable, since it facilitates growth in a lateral direction and as a result a high-quality layer can be formed. When growth is effected on an A face of sapphire, stripes may often appear on the grown surface. However, by using a buffer layer with pinholes, mirror-surface growth can be realized. In addition, GaN may be used as buffer layer for forming the nuclei. In this case, dissociation of nitrogen can be prevented by introducing a very small amount of ammonia to the last limit at which GaN grows.

Figure 9:
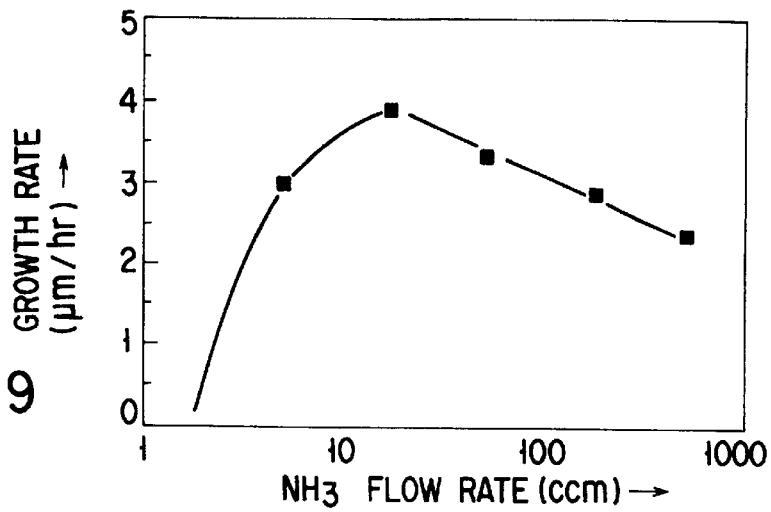
FIG. 9 is a characteristic graph showing the relationship between the flow rate of ammonia and the growth rate at the time of growing GaN.

FIG. 9 is a graph showing the relationship between the flow rate of ammonia and the speed of growth at the time of growing GaN. Even if the flow rate of ammonia is reduced to 1/200 (5 ml/min.) of the total flow rate, GaN grows. When the flow rate of ammonia is about 1/50 (20 ml/min.), the film thickness becomes the greatest. When ammonia of about 1/50 to 1/200 of the total flow rate is introduced, the dissociation of nitrogen is most reduced. Under such conditions, GaN can be used as a buffer layer material for forming the nuclei.

The present invention is not limited to the above embodiments. The device structures are not limited to those shown in the embodiments and can be modified where necessary. In brief, the present invention is applicable to the case where a semiconductor layer of AlGaInN material is formed on a single crystal substrate to form a light emitting element, etc. Besides, the substrate is not necessarily limited to a sapphire substrate, and a single crystal of an SiC or other material may be used. The present invention is not necessarily limited to a light emitting device, can be applicable to, e.g. a high-temperature operable semiconductor device. Other modifications may be made without departing from the spirit of the present invention.

As has been described above in detail, according to the present invention, the crystalline quality and reproducibility of a semiconductor layer for forming a device made of an AlGaInN-based material can be improved. As a result, an AlGaInN-based semiconductor layer of small defect can be grown, and a high-luminance, short-wavelength light emitting device, etc. can be fabricated.

Now consideration will be given of Mg used as a p-type dopant (acceptor impurity) of a nitride-based Group III–V compound semiconductor. If the activation ratio of Mg can be increased, it becomes possible to reduce the amount of added Mg and obtain a p-type layer with good surface flatness, small defect and low resistance. The inventors of the present invention examined the hydrogen concentration in a crystal, which is considered to be closely related to a decrease in activation ratio of Mg. As a result, it was found that hydrogen of a concentration substantially equal to a high Mg concentration was mixed in a doped layer, as compared to an undoped layer, and that the amount of mixed hydrogen could be reduced by heat treatment.

Figure 10:
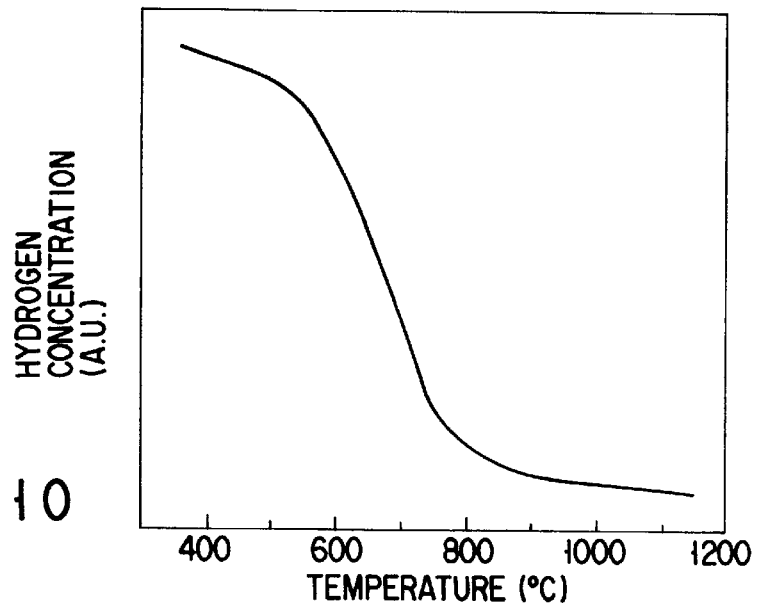
FIG. 10 is a characteristic graph showing the relationship between the temperature for thermal treatment of GaN and the hydrogen concentration in GaN.

FIG. 10 in a graph showing the relationship between the temperature for heat treatment and hydrogen concentration when the heat treatment was performed at various temperatures. A sample is Mg-doped GaN. The hydrogen concentration can be decreased by performing heat treatment at temperatures of 700° C. or above. In the case of a device requiring exact control of carrier concentration as in a semiconductor laser, it is necessary to limit the hydrogen concentration to 10% or less of the saturation concentration. In this case, treatment needs to be performed at 1000° C. or above. However, if treatment is performed at 800° C. or so, the degree of evaporation of a constituent element such as nitrogen increases steeply and the crystalline surface deteriorates considerably.

In order to prevent the deterioration of the surface due to high-temperature treatment, it is important to prevent evaporation of a constituent element such as nitrogen. According to the study by the inventors, it was found that evaporation of the constituent element can be curbed in a high temperature region where hydrogen can be removed, by choosing a proper method. Specifically, the surface is coated with another material (cap layer) and then subjected to heat treatment. It is important that the cap layer has heat resistance, does not include an element (e.g. donor type impurity such as Si or Se) adversely affecting the formation of p-type nitride layer due to diffusion, has good hydrogen permeability, has a lattice constant close to that of a nitride and no thermal distortion, and is a dense film non-permeable to nitrogen or Ga. In addition, since a cap layer is removed after completion of heat treatment, it is desirable that the cap layer be formed of a material which can be etched selectively in relation to an underlying nitride layer.

Of these conditions, the most important condition is that the cap layer includes no impurities forming a donor type or deep level which is a factor of an increase in resistance. Thus, a Group III–V compound semiconductor is suitable. Of the III–V compound semiconductors, those having lattice constant close to the lattice constant of a nitride are a nitride itself and BP (boron phosphide). However, BP is chemically stable and difficult to etch. In addition, GaN is difficult to selectively etch, and InN lacks heat resistance.

On the other hand, AlN has good heat resistance and can be selectively etched with hydrochloric acid, by these compounds have a problem relating to hydrogen permeability. However, according to the inventors' study, it was thought that the hydrogen permeability of the Group III–V nitride was remarkably increased by addition of an acceptor. For example, in the case of AlN, adequate hydrogen permeability can be obtained by adding Mg in an amount of $10^{17}$ to $10^{20}$ cm$^{-3}$. In particular, by doping the cap layer with the same impurity as the acceptor impurity of the cladding layer, it is possible to prevent an increase in contact resistance due to a decrease in carrier concentration of the surface being subjected to heat treatment. Accordingly, by using the acceptor-doped AlN as cap layer, hydrogen can be removed while curbing evaporation of the constituent element such as nitrogen.

$Al_2O_3$ is a substrate material conventionally used for forming a nitride layer as well, though its lattice constant is different from that of a nitride, and is free from the problem of involving a great thermal distortion in a cooling process after thermal treatment. Moreover, $Al_2O_3$ satisfies all other conditions as above-mentioned in relation to a cap layer. Furthermore, an $Al_2O_3$ cap layer can be formed more easily especially by sputtering and has an advantage to be easily etched by acid or alkaline etchant. Therefore the same effect is expected when $Al_2O_3$ is used for a cap layer in this invention.

As has been described above, in the present invention, after a heat-resistant cap layer of AlN in which a p-type dopant is added or $Al_2O_3$ is deposited, heat treatment of p-type layers is carried out. Thus, the heat treatment can be performed at higher temperatures, and hydrogen can be removed while curbing evaporation of the constituent element such as nitrogen. Thus, the activation ratio of Mg increases and a low-resistance, high-quality p-type nitride compound layer having good surface flatness can be formed without adding excessive Mg. Therefore, a high-performance, short-wavelength light emitting element such as a semiconductor laser can be realized.

In the above description, Mg is mentioned as an example of the acceptor impurity. The same advantage, however, can be obtained by carrying out heat treatment with a cap layer including such a doping material as to function as an acceptor of a nitride-based Group III–V compound semiconductor and to take in hydrogen in a doping layer at the same time.

(Embodiment 3)

Figure 11:
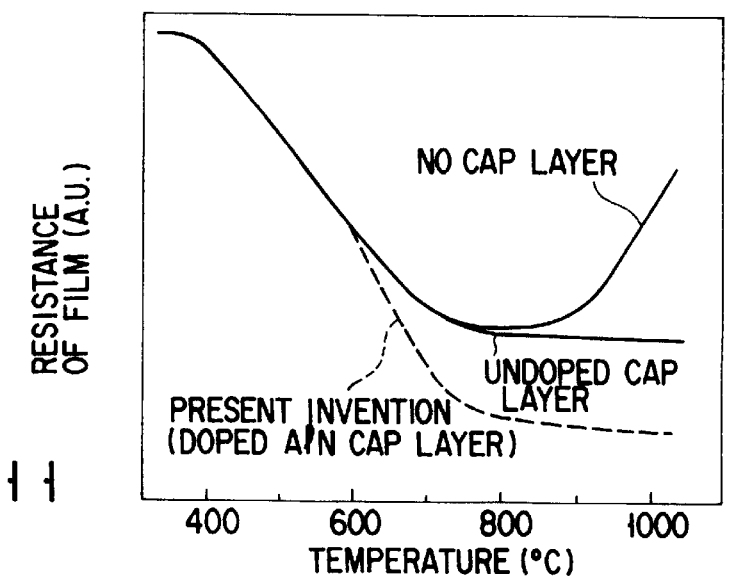
FIG. 11 is a characteristic graph showing the relationship between the temperature for thermal treatment and resistance value in GaN to which Mg is added.

FIG. 11 is a graph showing variations in resistance value of p-type layers in relation to heat treatment temperatures, in the case where GaN, to which Mg is added in an amount of $5\times10^{19}$ cm$^{-3}$, is subjected to heat treatment with use of the acceptor-doped AlN cap layer of the present invention, the GaN is subjected to heat treatment with use of an AlN cap layer doped with no acceptor, and the GaN is subjected to heat treatment without use of the cap layer.

When the cap layer is not used, the resistance value decreases in a heat treatment temperature range of 400° C. or above. The resistance value further decreases as the rise in treatment temperature. In a range of 700° C. to 900° C. the lowest resistance value is obtained. However, the resistance increases in a heat treatment temperature range of over 900° C. When the AlN-undoped cap layer is used, the resistance value decreases in a simple manner as the treatment temperature increases. In a range of 800° C. or above, the resistance value reaches a saturated level. On the other hand, in the method of the present invention, the resistance decreases remarkably as the treatment temperature rises even in a range of 700° C. or above. In a range of 800° C. or above, the resistance reducing effect does not greatly vary, but the resistance decreases in a simple manner up to a treatment temperature range of 1000° C. or above.

When the cap layer is not used, the hydrogen removing effect is improved with temperatures in a treatment temperature range of 700° C. or above. However, the degree of evaporation of the constituent element such as nitrogen increases simultaneously and the crystalline defect deteriorates further. It is considered that consequently the resistance value reducing effect is prevented, and the resistance value rises, although the treatment temperature is increased, in a temperature range of 900° C. or above. Dissociation of the constituent element from the surface can be prevented by using the AlN cap layer. In the case of not adding an acceptor, however, the hydrogen permeability is low and the resistance value reaches a saturated level. By contrast, in the method of the present invention, there is no increase in defect in a range of 700° C. or above, at which dissociation of the constituent element has been unignorable in the prior art, and hydrogen can be eliminated effectively. Therefore, a crystal of a lower resistance than in the prior art is obtained. This effect is conspicuous in a treatment temperature range of 800° C. or above.

The effect of improvement in hydrogen permeability of AlN by addition of an acceptor is obtained by addition of the acceptor in an amount of $10^{17}$ cm$^{-3}$. It is not desirable to add the acceptor in an amount of $10^{20}$ cm$^{-3}$ or more, since such an amount of acceptor degrades the quality of the layer.

Figure 12:
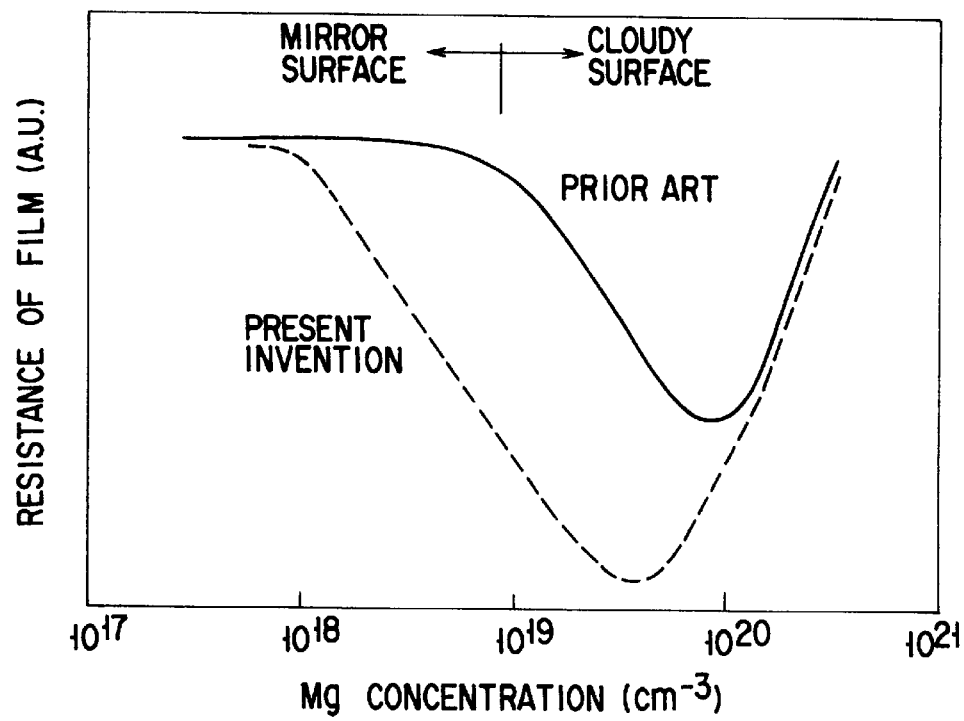
FIG. 12 is a characteristic graph showing the relationship between the Mg concentration and the resistance of film when a GaN layer was subjected to heat treatment in an Ar atmosphere.

FIG. 12 shows the relationship between the Mg concentration and the resistance value in a GaN layer which is subjected to heat treatment at 800° C. for 30 minutes in an Ar atmosphere. In a conventional method using no cap layer, a decrease in resistance value does not occur unless Mg is added in an amount of $10^{19}$ cm$^{-3}$ which results in cloudiness. By contrast, according to the method of the present invention wherein the acceptor-doped cap layer is used, the electrical activation ratio of Mg can be increased. Thus, the resistance value can be decreased at an Mg concentration of $10^{19}$ cm$^{-3}$ or less at which a flat film is obtainable. These advantages are obtained similarly with a mixed crystal of AlN, InN, etc.

Figure 13:
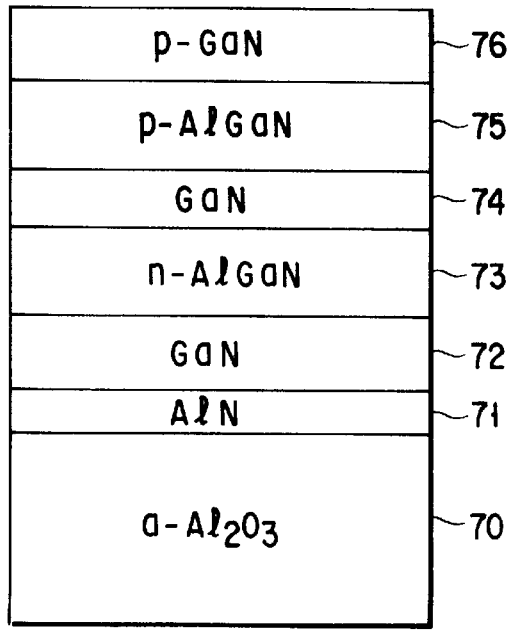
FIG. 13 is a cross-sectional view showing schematically the structure of a semiconductor laser according to a third embodiment of the invention.

FIG. 13 is a cross-sectional view of the device structure of a semiconductor laser fabricated by the method of the third embodiment of the present invention. On the C face of a sapphire substrate 70, the following layers are successively formed: an AlN (10 nm) first buffer layer 71, a GaN (1.0 μm) second buffer layer 72, an Si-doped n-type AlGaN (1.0 μm) cladding layer 73, a GaN (0.5 μm) active layer 74, an Mg-doped p-type AlGaN (1.0 μm) cladding layer 75, and an Mg-doped p-type GaN (0.5 μm) contact layer 76. Although not shown, electrodes are provided on a side surface of the n-type cladding layer 73 and a top surface of the p-type contact layer 76.

Figure 14:
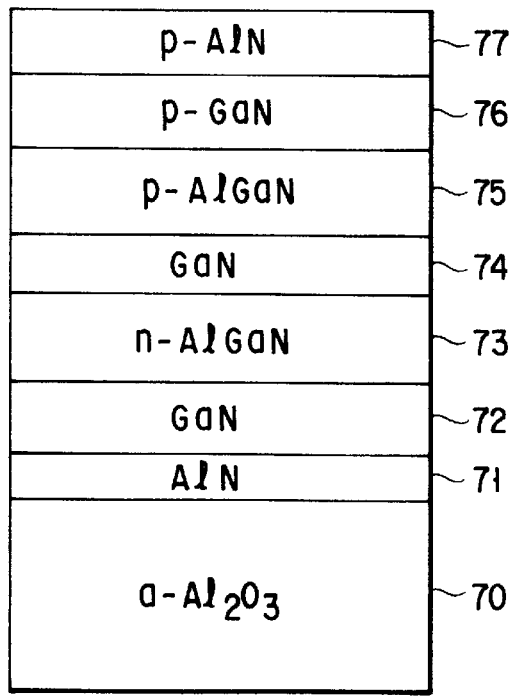
FIG. 14 is a cross-sectional view of a semiconductor laser in the state in which an AlN cap layer is formed for a process of hydrogen removal.

Like the semiconductor laser of Embodiment 1, the semiconductor laser of the present embodiment can be fabricated by using the growing apparatus (FIG. 4) used in Embodiment 1. In the present embodiment, in order to increase the activation ratio of p-type dopant Mg in the Mg-doped p-type AlGaN cladding layer 75 and p-type GaN contact layer 76, an Mg-doped AlN cap layer 77 (10 to 1000 nm) is formed on the contact layer 76, as shown in FIG. 14. After the resultant is cooled to room temperature, heat treatment is carried out at 800 to 1200° C. in a hydrogen-free gas such as nitrogen or in a vacuum. Thereafter, the AlN cap layer 77 is removed by an acid containing hydrochloric acid or phosphoric acid or an alkali etching liquid containing NaOH, KOH, etc. The heat treatment may be carried out in a vacuum, but it is effective to perform it in a hydrogen-free gas since evaporation of the constituent element can be prevented.

More specifically, AlGaN is grown by introducing, as material, $NH_3$ at $1\times10^{-3}$ mol/min., $Ga(CH_3)_3$ at $1\times10^{-5}$ mol/min., and $Al(CH_3)_3$ at $1\times10^{-6}$ mol/min. In the case of GaN, the supply of Al is stopped. In the case of AlN, the supply of Ga is stopped. The temperature of the substrate is 1050° C., the pressure is 75 Torr, and the flow rate of the total material gas is 1 l/min. The doping material for the cladding layers 73 and 75 is $SiH_4$ as n-type material and $(C_2H_5)_2Mg$ as p-type material. The heat treatment after AlN cap layer 77 formation is performed at 1000° C. for 30 minutes in Ar atmosphere in the growing apparatus as shown in FIG. 4. The cap layer 77 is etched away by hydrochloric acid at 60° C. for 15 minutes.

In the thus fabricated semiconductor laser, the Mg activation rate of p-type GaN-based compound semiconductor layers (AlGaN cladding layer 73 and GaN contact layer 75) can be increased. Thus, without excessively adding Mg, a low-resistance, p-type GaN-based compound semiconductor layer can be formed. Therefore, a high-quality, p-type GaN-based compound semiconductor layer can be grown and the performance and life of the short-wavelength semiconductor laser can be increased.

As a modification of the third embodiment of this invention, there is fabricated a semiconductor laser in which an $Al_2O_3$ cap layer is formed in place of an Mg-doped AlN cap layer and other conditions are all the same as the third embodiment. More specifically, an $Al_2O_3$ cap layer is formed by use of sputtering, the resultant is cooled to room temperature and subjected to heat treatment at 1000° C. for 30 minutes in Ar atmosphere, and the $Al_2O_3$ cap layer is etched away by hydrochloric acid at 70° C. for 15 minutes. In this case as well, the Mg activation rate of the obtained p-type GaN-based compound semiconductor layers can be increased. Without excessively adding Mg, a low resistance and high-quality p-type GaN-based compound semiconductor layer can be grown.

The present invention is not limited to the above embodiments. In the third embodiment, GaN or AlGaN is used as material of a low-resistance, p-type compound semiconductor layer. However, the present invention is not limited to such a GaN-based compound semiconductor, and a nitride-based Group III–V compound semiconductor may be used. The thickness of the cap layer, the doping amount of the acceptor, the heat treatment temperature after the formation of the cap layer, etc. may be modified on an as-needed basis. Besides, the present invention is applicable not only to the semiconductor laser but also to the manufacture of a light emitting diode. Furthermore, this invention is applicable to the manufacture of various semiconductor devices having layers of p-type nitride-based Group III–V compounds. Other modifications may be made to the invention without departing from the spirit of the invention.

As has been described above, according to the present invention, the acceptor-doped AlN or $Al_2O_3$ cap layer is formed on the acceptor-doped nitride-based Group III–V compound semiconductor layer, and the resultant structure is subjected to heat treatment. Thus, the heat treatment temperature is raised and hydrogen can be removed while curbing evaporation of a constituent element such as nitrogen. Therefore, the electrical activation ratio of acceptor impurity in the nitride-based Group III–V compound semiconductor layer can be increased and the high-quality p-type layer can be formed. This contributes to realization of a high-performance, short-wavelength semiconductor laser, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:
a single crystal substrate;
a nucleus formation buffer layer formed on said single crystal substrate; and
a lamination layer including a plurality of $Al_{1-x-y}Ga_xIn_yN$ ($0 \leq x \leq 1, 0 \leq y \leq 1, x+y \leq 1$) layers laminated above said nucleus formation buffer layer,
wherein said nucleus formation buffer layer is formed of $Al_{1-s-t}Ga_sIn_tN$ ($0 \leq s \leq 1, 0 \leq t \leq 1, s+t \leq 1$) and formed on a surface of said substrate with an average film thickness of 5 nm to 20 nm such that said nucleus formation buffer layer has a number of pinholes for control of polarity and formation of nuclei, said pinholes being formed among loosely formed small crystals of $Al_{1-s-t}Ga_sIn_tN$ ($0 \leq s \leq 1, 0 \leq t \leq 1, s+t \leq 1$).

2. The semiconductor device according to claim 1, wherein said $Al_{1-s-t}Ga_sIn_tN$ ($0 \leq s \leq 1, 0 \leq t \leq 1, s+t \leq 1$), of which said nucleus formation buffer layer is formed, is $Al_{1-s}Ga_sN$ ($0 \leq s \leq 1$).

3. The semiconductor device according to claim 1, wherein said $Al_{1-s-t}Ga_sIn_tN$ ($0 \leq s \leq 1, 0 \leq t \leq 1, s+t \leq 1$), of which said nucleus formation buffer layer is formed, is GaN.

4. The semiconductor device according to claim 1, wherein said nucleus formation buffer layer is formed in an atmosphere containing ammonia supplied at a flow rate of 1/200 to 1/50 of a total flow rate of material gases.

5. The semiconductor device according to claim 1, wherein a temperature raising process from the completion of formation of said nucleus formation buffer layer to the beginning of formation of said lamination layer is performed in an ammonia-free atmosphere.

6. The semiconductor device according to claim 1, wherein said lamination layer is formed in an atmosphere at 70 Torr or less.

7. The semiconductor device according to claim 1, wherein said single crystal substrate is formed of sapphire.

8. The semiconductor device according to claim 7, wherein a face to be processed of said single crystal substrate is a c face of said sapphire substrate.

9. The semiconductor device according to claim 7, wherein a face to be processed of said single crystal substrate is inclined by 0.5 to 10 degrees from a c face toward an a face of said sapphire substrate.

10. The semiconductor device according to claim 1, wherein said lamination layer constitutes a light emitting diode of a double hetero structure wherein an active layer is sandwiched between a p-type cladding layer and an n-type cladding layer.

11. The semiconductor device according to claim 1, further comprising a distortion reducing buffer layer formed of $Al_{1-u-v}Ga_uIn_vN$ ($0 \leq u \leq 1, 0 \leq v \leq 1, u+v \leq 1$) on said nuclei formation buffer layer, a thickness of said distortion reducing buffer layer being greater than that of said nuclei formation buffer layer.

12. The semiconductor device according to claim 11, wherein said distortion reducing buffer layer is grown at temperatures between 350° C. and 800° C.

13. The semiconductor device according to claim 11, wherein said $Al_{1-u-v}Ga_uIn_vN$ ($0 \leq u \leq 1, 0 \leq v \leq 1, u+v \leq 1$), of which said distortion reducing buffer layer is formed, is $Ga_{1-v}In_vN$ ($0 \leq v \leq 1$).

14. The semiconductor device according to claim 11, further comprising a cap layer, provided on said distortion reducing buffer layer, for preventing evaporation of In contained in said thermal distortion reducing buffer layer.

15. A semiconductor laser comprising:

a single crystal substrate;

a first layer made of a single crystal and formed on said single crystal substrate; and a lamination layer including a plurality of $Al_{1-x-y}Ga_xIn_yN$ ($0 \leq x \leq 1$, $0 \leq y \leq 1$, $x+y \leq 1$) layers laminated above said first layer, wherein said first layer is formed of $Al_{1-s-t}Ga_sIn_tN$ ($0 \leq s \leq 1$, $0 \leq t \leq 1$, $s+t \leq 1$) and formed on a surface of said substrate with an average film thickness of 5 nm to 20 nm such that said first layer has a number of pinholes formed among $Al_{1-s-t})Ga_sIn_tN$ ($0 \leq s \leq 1$, $0 \leq t \leq 1$, $s+t \leq 1$).

* * * * *